United States Patent [19]
Yamazaki et al.

[11] Patent Number: 5,366,579
[45] Date of Patent: * Nov. 22, 1994

[54] INDUSTRIAL DIAMOND COATING AND METHOD OF MANUFACTURING

[75] Inventors: Shunpei Yamazaki, Tokyo; Masaya Kadono, Atsugi, both of Japan

[73] Assignee: Semiconductor Energy Laboratory Co., Ltd., Kanagawa, Japan

[*] Notice: The portion of the term of this patent subsequent to Oct. 19, 2010 has been disclaimed.

[21] Appl. No.: 666,671

[22] Filed: Mar. 7, 1991

[30] Foreign Application Priority Data

Mar. 26, 1990 [JP] Japan .................................. 2-76308

[51] Int. Cl.$^5$ ................................................. B32B 9/00
[52] U.S. Cl. ..................................... 156/247; 156/230; 427/249; 428/408; 51/295
[58] Field of Search ............... 156/230, 240, 233, 289, 156/247; 427/249; 51/293, 295, 298; 428/408

[56] References Cited

U.S. PATENT DOCUMENTS

| | | | |
|---|---|---|---|
| 3,942,959 | 3/1976 | Markoo et al. | 51/295 |
| 4,101,698 | 7/1978 | Dunning et al. | 156/230 |
| 4,179,324 | 12/1979 | Kirkpatrick | 156/230 |
| 4,919,974 | 4/1990 | McCune et al. | 427/249 |
| 4,968,326 | 11/1990 | Wiand | 51/293 |
| 5,061,292 | 10/1991 | Chen et al. | 51/293 |
| 5,082,359 | 1/1992 | Kirkpatrick | 427/249 |
| 5,254,141 | 10/1993 | Yamazaki et al. | 51/295 |

FOREIGN PATENT DOCUMENTS

| | | |
|---|---|---|
| 207467 | 1/1987 | European Pat. Off. . |
| 319926 | 6/1989 | European Pat. Off. . |
| 402671 | 12/1990 | European Pat. Off. . |

Primary Examiner—David A. Simmons
Assistant Examiner—J. Sells
Attorney, Agent, or Firm—Sixbey, Friedman, Leedom & Ferguson

[57] ABSTRACT

An industrial diamond thin film coating on an object and a method of manufacturing the same are described. A diamond film is first formed on a substrate other than the object to be coated. The diamond film is then joined to the object by means of an adhesive. Finally, the substrate may be removed from the diamond film which is already fixed to the object to provide a hard surface for the same.

24 Claims, 3 Drawing Sheets

5,366,579

INDUSTRIAL DIAMOND COATING AND METHOD OF MANUFACTURING

BACKGROUND OF THE INVENTION

1. Field of the Invention

The present invention relates to an industrial diamond thin film coating and a method of manufacturing the same.

2. Description of the Prior Art

The life time of machine tools such as cutting tools and grinding tools or other instruments having very hard surfaces or abrasive edges can be prolonged by coating, directly on the hard surfaces or abrasive edges, protection films made of very hard materials such as diamond, titanium carbide, titanium nitride, carbonated titanium nitride, aluminum oxide. Particularly, diamond coating has been believed to be very effective in the cases of coating on surfaces made of nonferrous metals or ceramics.

Such coatings have been formed on surfaces of the tools typically by thermal CVD (chemical vapor deposition) in an apparatus as illustrated in FIG. 1. The apparatus comprises a vacuum chamber 31, a tungsten filament 33 and a holder 35. After mounting an object 34 on the holder 35, a large electric current is caused to pass the filament 33 in order to emit thermal electrons at 1500° C. to 1300° C. A reactive gas comprising carbon is introduced into the chamber from an inlet port 32 at the same time. By virtue of the thermal electrons, the reactive gas is decomposed to coat the object 34 with a diamond film. During coating, the temperature of the object 34 is kept at 400° C. to 1300° C. and the pressure in the chamber at 1 Torr to 350 Torr.

One of the practical problems of these technique is the coming-off or rubbing-off of the diamond film from the surface of a tool. Until now, there has not been yet accomplished sufficient adhesivity of diamond coatings to the surfaces of tools. The difference in thermal expansion coefficient between the diamond film and the underlying surfaces has been considered as a cause of separation of the diamond films from the surface.

Furthermore, it is another shortcoming of the prior art technique that diamond coating is deposited only on such small areas as about Φ 2 cm so that the diamond films become very expensive. Still further, because of undesirable disparity in film quality over one surface, the applications in practice have been substantially limited.

BRIEF SUMMARY OF THE INVENTION

It is an object of the present invention to provide a diamond thin film coating and a method of manufacturing the same which is hardly separated from the underlying surface.

It is another object of the present invention to provide a diamond thin film coating and a method of manufacturing the same at a low production cost.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with tile present invention, as embodied and broadly described herein, a diamond film is first synthesized on a substrate other than an object to be coated. The diamond film is then joined to the object by means of an adhesive. Finally, the substrate is removed from the diamond film which is already fixed to the object to provide a hard surface for the same. When the object is a cutting tool, it is desired that the tool is made from a material having a high tenacity and a low thermal expansion coefficiency.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Referring now to FIG. 2 and FIGS. 3(A) to 3(C), a method of manufacturing carbon coating in accordance with an embodiment of the present invention will be explained.

Figure 1:
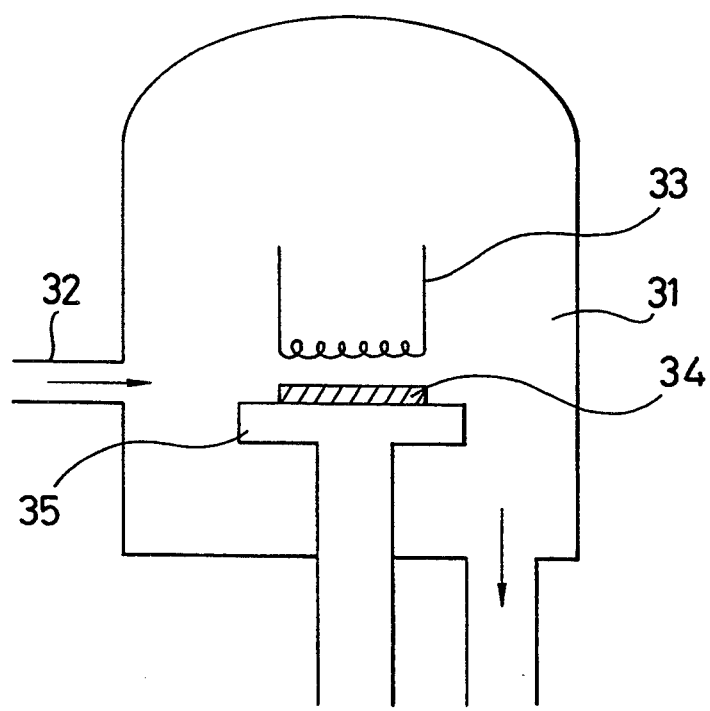
FIG. 1 shows a thermal CVD apparatus for explaining a conventional method of forming a diamond coating.
Figure 2:
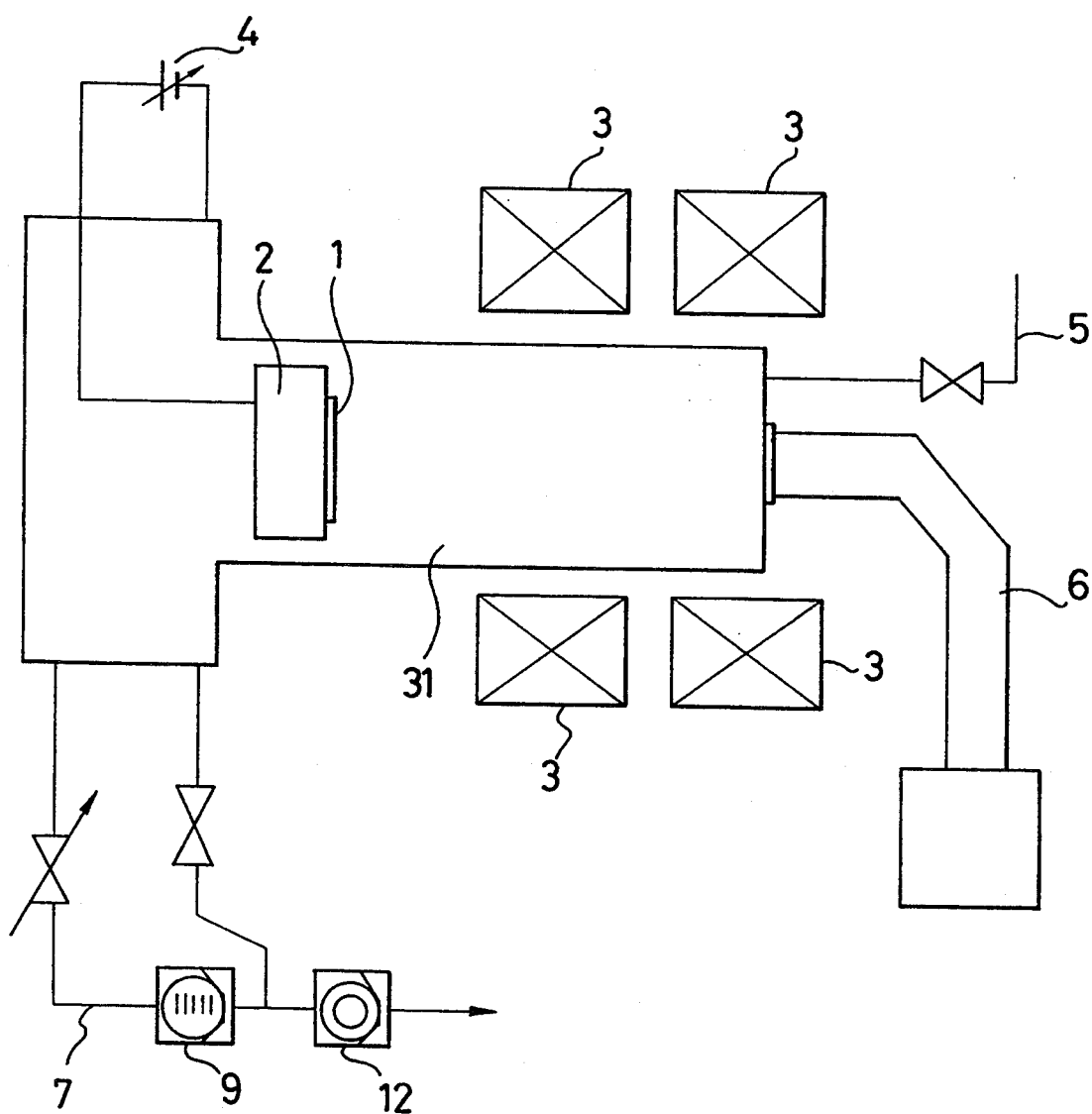
FIG. 2 is a schematic diagram showing a microwave assisted CVD apparatus for explaining a method of forming a diamond coating in accordance with the present invention.

FIG. 2 illustrates a microwave assisted CVD apparatus for carrying out deposition of diamond in a magnetic field. The apparatus comprises a vacuum chamber 31, a holder 2 provided in the chamber 31, a voltage source 4 for applying a suitable bias voltage to the holder 2, a microwave generator 6 coupled with the chamber 31, a gas introduction system 5 for introducing a reactive gas into the chamber 31, Helmholtz coils 3 surrounding the chamber 31 and an evacuation system 7 including a turbo molecular pump 9 and a rotary pump 12 for maintaining the pressure in the chamber at an appropriate level and removing exhausted gas therefrom.

After mounting a substrate 1 to be coated on the holder 2 in the chamber 31 and evacuating the chamber 31 by means of the system 7, a reactive gas consisting of methanol (50 ccm) and hydrogen (100 ccm) is introduced into the chamber from the gas introduction system 5. The strength of a magnetic field induced by the coils 3 is controlled at a suitable level, e.g. 875 Gauss or higher at the substrate surface. Microwaves (2.45 GHz) are inputted from the generator 6 at 4 KW. The reactive gas is then activated into a high energy plasma and decomposed to grow diamond crystals on the surface of the substrate 1 at a reaction pressure of 0.25 Torr. The temperature of the substrate 1 is kept at 800° C. during the deposition. Accordingly, a 10 $\mu$m thick diamond film is coated on the substrate by deposition continued for 20 hours. The surface of the substrate is given scratches in advance to provide seeds for crystal growth thereon by ultrasonic treatment for ten minutes in a solution in which diamond particles of 10 $\mu$m to 200 $\mu$m diameter are dispersing.

The use of the deposition method of this type is very desirable because the deposition area can be increased to Φ 10 cm or wider which is wider than those of the conventional method by a factor of 20 or more.

Figure 3A:
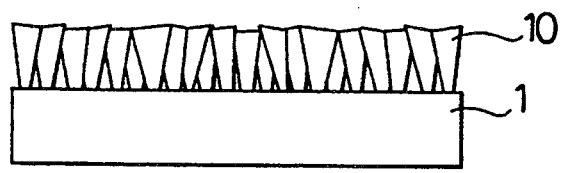
FIGS. 3(A) to 3(C) are cross sectional views showing a method of forming a diamond coating in accordance with the present invention.

FIG. 3(A) is a diagram showing a cross sectional view of the diamond crystals grown from the substrate 1 in the form of a thin film as designated by numeral 10. As shown in the figure, the crystals are grown in inverted conical shapes. The contact areas of the crystals to the underlying surface of the substrate are vary small because of the inversion of the cones, resulting in poor adhesivity.

Figure 3B:
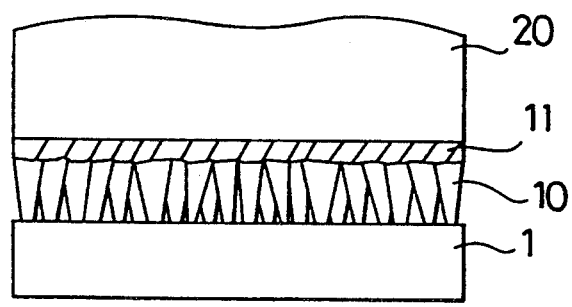

The substrate 1 coated with the diamond film 10 is then removed from the chamber and joined to the surface of an object 20 to be reinforced by the diamond film by means of a solder 11 such as gold solder as shown in FIG. 3(B). The object is, for example, the abrasive surface of a grinder made of tungsten carbide. Other adhesive can be used in place of the solder such as suitable heat-resistant strong adhesives, for example, epoxy/phenolic, nitiril/phenolic. The surface of the diamond film 10 may be given, if desired, plasma treatment or sand blast treatment in advance of the joining in order to enhance the adhesivity thereof to the object 20. Finally, the substrate I is eliminated from the diamond film 10 by mechanical grinding as shown in FIG. 3(C).

Figure 3C:
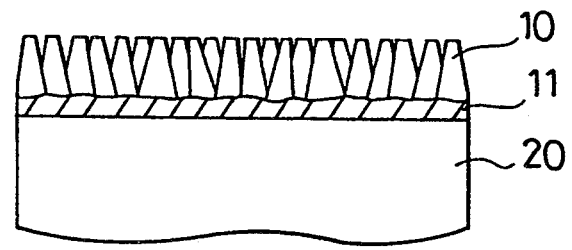

As easily understood from FIG. 3(C), the contact areas of the diamond crystals 10 and the surface of the object 20 are substantially increased by this procedure so that mechanical strength of the coating structure can be greatly improved, resulting also from the effects of the adhesive. In accordance with experiments, the life time of grinding tools provided with such diamond coatings in accordance with the present invention was prolonged by a factor of 5 or more as compared with conventional products.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

For example, elimination of a substrate provided on an object may be dispensed with in order to save a manufacturing time. Even if the substrate does not have sufficient hardness, a diamond coating provided between the substrate and the object can protect the object. A variety of objects can be coated in the same manner by preparing the substrate 1 as a mold which has a surface conforming to the surface of an object to be coated. The deposition method as described above is very appropriate because even if the objects have complicated surfaces, uniform diamond coatings can be deposited by this method. Elimination of an unnecessary substrate 1 can be done also by use of suitable chemicals (solvent) capable of dissolving the substrate.

What is claimed is:

1. A method of forming a diamond coating comprising a number of diamond crystals on a surface comprising:
    forming said diamond coating directly on a substrate;
    treating said diamond coating with a plasma or sand blast in order to enhance the adhesivity of the coating to said surface;
    joining said diamond coating after the plasma treating or sand blast treating to said surface by means of an adhesive; and
    removing said substrate from said diamond coating.

2. The method of forming a diamond coating as claimed in claim 1 wherein said diamond coating is formed on said substrate by chemical vapor deposition.

3. The method of forming a diamond coating as claimed in claim 2 wherein said diamond coating is deposited on said substrate by microwave assisted chemical vapor deposition.

4. The method of forming a diamond coating as claimed in claim 3 wherein said microwave assisted chemical vapor deposition is carried out in a magnetic field.

5. The method of forming a diamond coating as claimed in claim 4 wherein said microwave assisted chemical vapor deposition is carried out by the use of a reactive gas comprising methanol and hydrogen.

6. The method of forming a diamond coating as claimed in claim 1 wherein said adhesive is a solder.

7. The method of forming a diamond coating as claimed in claim 1 wherein said adhesive is epoxy/phenolic.

8. The method of forming a diamond coating as claimed in claim 1 wherein said adhesive is nitril/phenolic.

9. The method of forming a diamond coating as claimed in claim 1 wherein said substrate is given scratches in advance of the formation of said diamond coating.

10. The method of forming a diamond coating as claimed in claim 9 wherein said scratches are given by ultrasonic treatment in a liquid carrying diamond particles.

11. The method of forming a diamond coating as claimed in claim 1 wherein said diamond coating is given plasma treatment in advance of the joining step.

12. The method of forming a diamond coating as claimed in claim 1 wherein said diamond coating is given sand blast treatment in advance of the joining step.

13. The method of forming a diamond coating as claimed in claim 1 wherein said substrate is removed by mechanical grinding.

14. The method of forming a diamond coating as claimed in claim 1 wherein said substrate is removed by the use of a suitable chemical capable of dissolving the substrate.

15. The method of claim 1 wherein said diamond crystals are substantially conical in shape where the bases of the conical shaped crystals substantially face toward said surface.

16. An industrial diamond coating formed on a surface characterized in that said coating is fixed to said surface by an adhesive therebetween wherein said coating comprises a polycrystalline diamond film formed by the steps comprising;
    forming said polycrystalline diamond film by vapor phase deposition on a substrate;
    treating the surface of the diamond film with a plasma or sand blast in order to enhance the adhesivity of the film to said surface;
    joining said diamond film to said surface using said adhesive; and
    removing said substrate from said diamond film.

17. The industrial diamond coating as claimed in claim 16 wherein said adhesive is a solder.

18. The industrial diamond coating as claimed in claim 16 wherein said adhesive is epoxy/phenolic.

19. The industrial diamond coating as claimed in claim 16 wherein said adhesive is nitril/phenolic.

20. The industrial diamond coating as claimed in claim 16 wherein said surface is the working surface of a machine tool.

21. The industrial diamond coating as claimed in claim 16 wherein said surface is the working surface of a grinder.

22. The coating of claim 16 wherein said polycrystalline diamond film comprises substantially conical shaped crystals where the bases of the conical shaped crystals substantially face toward said surface.

23. A method of forming a diamond coating on a surface of an object comprising the steps of:

forming a diamond film comprising a number of diamond crystals on a temporary substrate by a vapor phase deposition;

attaching said diamond film supported by said temporary substrate to the surface of the object by an adhesive; and removing said temporary substrate in order that said diamond film remains on said surface, wherein said diamond crystals are substantially conical in shape where the bases of the conical shaped crystals substantially face toward said one surface.

24. An industrial diamond coating fixed to a surface by an adhesive, wherein said diamond coating comprises a number of diamond crystals, said crystals being substantially conical in shape where the bases of the conical shaped crystals substantially face toward said surface.

* * * * *